(12) United States Patent
Tokashiki

(10) Patent No.: US 6,372,654 B1
(45) Date of Patent: Apr. 16, 2002

(54) APPARATUS FOR FABRICATING A SEMICONDUCTOR DEVICE AND METHOD OF DOING THE SAME

(75) Inventor: Ken Tokashiki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/543,734

(22) Filed: Apr. 5, 2000

(30) Foreign Application Priority Data

Apr. 7, 1999 (JP) ............................................. 11-100112

(51) Int. Cl.⁷ ............................................. H01L 21/3065
(52) U.S. Cl. ........................ 438/712; 438/714; 438/720; 438/732; 438/742
(58) Field of Search ........................... 438/710, 711, 438/712, 714, 720, 732, 742

(56) References Cited

U.S. PATENT DOCUMENTS

| | | | | |
|---|---|---|---|---|
| 5,614,060 A | * | 3/1997 | Hanawa ........................ | 438/720 |
| 5,997,687 A | * | 12/1999 | Koshimizu ................... | 156/345 |
| 6,187,685 B1 | * | 2/2001 | Hopkins et al. ............. | 438/710 |
| 6,218,196 B1 | * | 4/2001 | Ise et al. ..................... | 438/689 |
| 6,255,221 B1 | * | 7/2001 | Hudson et al. ............. | 438/710 |

FOREIGN PATENT DOCUMENTS

| | | |
|---|---|---|
| JP | 6-267900 | 9/1994 |
| JP | 61-13625 | 1/1996 |
| JP | 8-181125 | 7/1996 |
| JP | 9-92645 | 4/1997 |
| JP | 11-8224 | 1/1999 |
| JP | 11-67741 | 3/1999 |

OTHER PUBLICATIONS

Japanese Office Action dated Dec. 5, 2001 with partial English translation.

* cited by examiner

Primary Examiner—Benjamin L. Utech
Assistant Examiner—Binh X Tran
(74) Attorney, Agent, or Firm—McGinn & Gibb, PLLC

(57) ABSTRACT

There is provided a method of fabricating a semiconductor device, including the steps of (a) generating plasma in the following conditions: (a1) an RF bias voltage has a frequency equal to or greater than 1 MHz, (a2) an RF source voltage has a frequency equal to or greater than 1 MHz, (a3) the RF source voltage is modulated by pulses in a cycle equal to or greater than 100 μsec, and (a4) pulse-on time is equal to or greater than 50 μsec, and (b) patterning multi-layered metal wirings by etching through the plasma The method makes it possible to reduce charging damage to a gate insulating film, even if wirings are further spaced away from adjacent ones and/or an antenna ratio of multi-layered metal wirings is further increased.

11 Claims, 12 Drawing Sheets

SUCCESSIVE DISCHARGE

50 μsec ON/50 μsec OFF

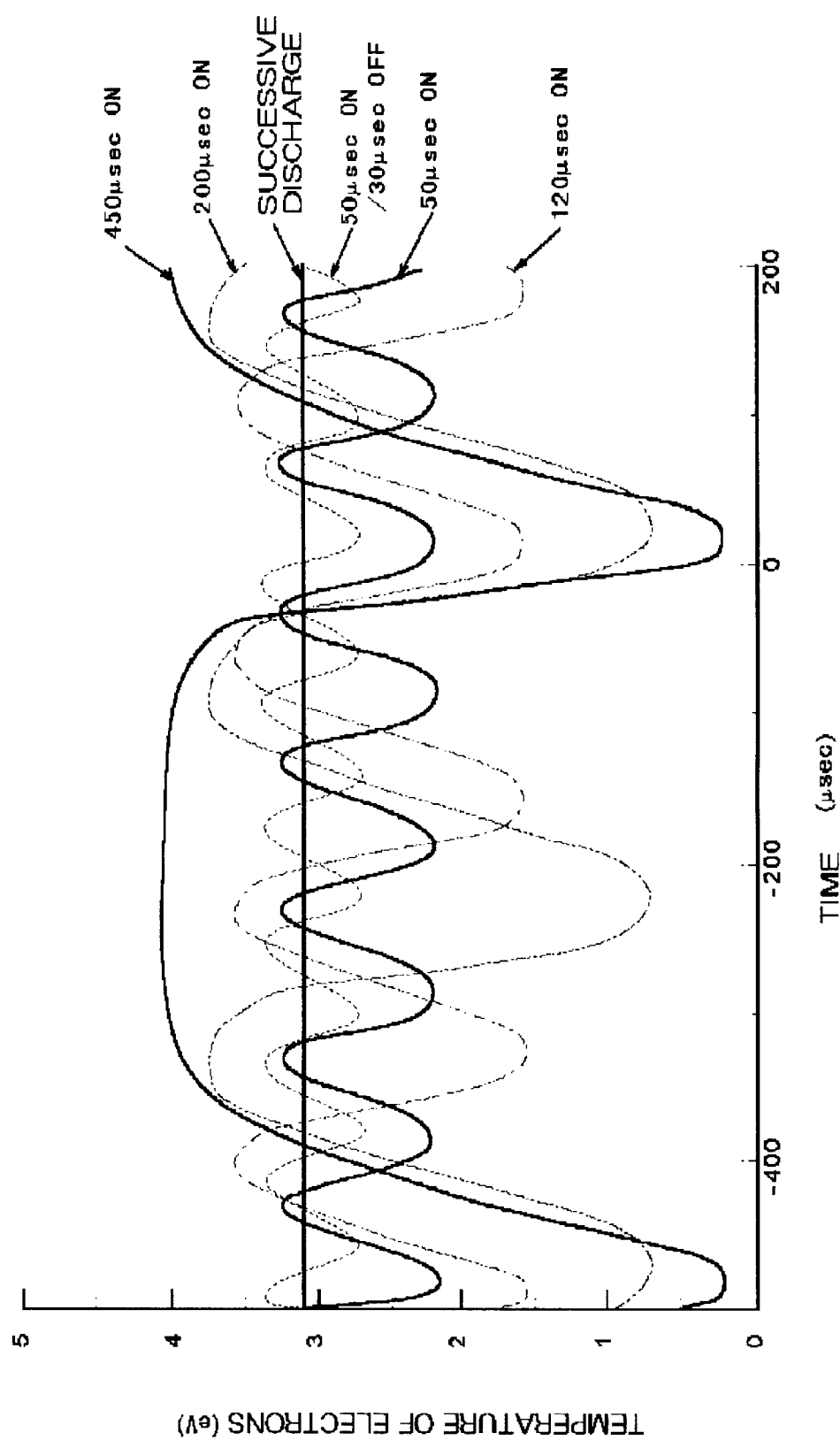

US 6,372,654 B1

APPARATUS FOR FABRICATING A SEMICONDUCTOR DEVICE AND METHOD OF DOING THE SAME

BACKGROUND OF THE INVENTION

Field of the Invention

The invention relates to a method and an apparatus for fabricating a semiconductor device, and more particularly to such a method including a step of patterning multi-layered metal wirings composed of aluminum, through inducive coupling plasma, and also to such an apparatus for generating inducive coupling plasma to thereby pattern multi-layered metal wirings.

DESCRIPTION OF THE RELATED ART

A wiring layer is required to be patterned in a size smaller and smaller with enhancement in integration of LSI. In order to transfer a small-sized mask pattern to a layer such as an electrically conductive layer and an insulating layer, such a layer is usually etched by anisotropic dry etching which makes use of plasma, such as reactive ion etching (RIE) and electron cyclotron resonance (ECR) plasma etching.

On the other hand, as a semiconductor device has been fabricated in a size smaller and smaller, a gate insulating film in an insulating gate type field effect transistor (FET) is made thinner and thinner. For instance, a latest gate insulating film is designed to have a thickness of 10 nm or smaller. Such a thin gate insulating film is likely to be damaged by just small electric stress.

An electrically conductive layer is usually composed of aluminum or alloy thereof. There are known a couple of anisotropic dry etching methods in which plasma is generated, as methods for dry-etching such an electrically conductive layer.

For instance, in one of such dry etching methods, an electrically conductive layer composed of aluminum or alloy thereof, formed on a semiconductor substrate, is etched with a patterned resist film being used as a mask through plasma generated from a mixture gas of and $Cl_2$ gas. In plasma, the $BCl_3$ gas exists as $BCl^{2+}$, and the $Cl_2$ gas produces Cl radicals. These Cl species make chemical reaction with aluminum or alloy thereof of which the electrically conductive layer is composed, to thereby generate volatile $AlCl_3$ having high vapor pressure. The thus generated volatile $AlCl_3$ is evaporated, and resultingly, the electrically conductive layer composed of aluminum or alloy thereof is etched.

In a plasma etching process, electrons as well as the above-mentioned Cl ion species are incident to a substrate. If there is a difference between incident positive and negative electric charges, electric charges are accumulated in an electrically conductive layer which is formed on a gate insulating film and is electrically insulated from the substrate. As a result, there is generated a difference in a voltage between the electrically conductive layer and the substrate. Such a difference in a voltage allows tunnel current to pass through the gate insulating film, resulting in that dielectric characteristics of the gate insulating film is varied, and hence, the gate insulating film might reach dielectric breakdown.

As mentioned above, a plasma etching process in which a gate electrode or an electrically conductive layer formed on a gate insulating film, and electrically conductive layers electrically connected to the gate electrode (hereinafter, a gate electrode and such electrically conductive layers are referred to as "gate wirings") are charged up, that is, electric charges are accumulated in the gate wirings, might cause the gate insulating film to be damaged. A plasma etching process is carried out, for instance, when a gate wiring layer is patterned, when a contact hole is formed reaching a gate wiring layer, when a contact hole reaching a gate insulating layer is cleaned by sputter etching, and when plasma-enhance chemical vapor deposition is carried out to a surface of a substrate at which a gate wiring layer partially appears.

In addition, if plasma formed non-uniformly above a semiconductor substrate, there would be generated a difference between an ion current and an electron current both to be introduced into the semiconductor substrate. This difference might allow a tunnel current to pass through a gate insulating film.

As a semiconductor device is integrated highly and highly, an antenna ratio defined as a ratio of an area of a gate insulating film to an area of an electrically conductive layer composed of aluminum or alloy thereof is significantly increased. When an electrically conductive film having a high antenna ratio is to be etched by a plasma etching process, small non-uniformity in plasma might allow much tunnel current to pass through a gate insulating film.

It has been reported that even if there is generated plasma having a profile of electric charges which is uniform to a flat surface, there would occur charging damage called electron shading damage inherent to high-density plasma etching, in a plasma etching step in which a resist mask including an aperture having a high aspect ratio, that is, a narrow space.

The above-mentioned electron shading damage is caused by both charge imbalance between ion flux and electron flux at a bottom of a space formed between wirings, and micro-loading which is one of characteristics of dry etching.

Hereinbelow is explained the electron shading damage with reference to FIG. 1.

With reference to FIG. 1, in ion sheath formed in an electrode to which RF voltage is applied when plasma is discharged, ion flux 101 is anisotropically incident to spaces formed between adjacent metal wirings 105, whereas electron flux 102 is isotropically incident to the spaces in the same manner as electron flux being incident in plasma bulk.

Anisotropy of the electron flux 102 causes a majority of electrons 104 is incident onto sidewalls of an insulating mask such as resist masks 103. As a result, the electrons 104 are much accumulated on the sidewalls of the resist masks 103 to thereby generate a negative voltage on the resist masks 103. As a space between the resist masks 103 is small, that is, as an aspect ratio is high, negative voltages generated on the sidewalls of the resist masks 103 overlap each other, resulting in that the negative voltages generated around the resist masks 103 are further increased. Accordingly, an amount of the electron flux 102 reaching bottoms 106 of holes formed between the adjacent resist masks 103 is significantly reduced. Thus, there is generated imbalance between the electron flux 102 and the ion flux 101 at the bottoms 106 of the holes having a high aspect ratio.

Dry etching has many characteristics, one of which is micro-loading effect. Herein, the micro-loading effect is a phenomenon in which an etching rate varies in dependence on an aspect ratio. In general, an etching rate lowers as an aspect ratio increases. Hence, though the metal wirings 105 have been already etched in portions having a relatively low aspect ratio, the bottoms 106 of the holes having a relatively high aspect ratio have not been etched yet. In a period of time after the portions having a relatively low aspect ratio have been etched for removal until the bottoms 106 have been completely etched (hereinafter, such a period of time is referred to as "injection time"), positive electric charges are accumulated on the bottoms 106 due to charge imbalance.

As a result, a gate electrode 108 has a positive voltage relative to a silicon substrate 109. Then, electrons 111 are injected into the gate electrode 108 from the silicon substrate 109 through a gate oxide film 110 in order to dissolve the charge imbalance. A current caused by the injected electrons 111 is in proportion to both a gate voltage and the above-mentioned injection time.

If a current caused by the injected electrons 111 flow excessively through the gate oxide film 110, the gate oxide film 110 would be degraded and/or damaged.

The explanation mentioned above is the reason why the electron shading damage occurs.

Many attempts have been made to uniformize plasma by generating plasma by virtue of pulse modulation. For instance, Japanese Unexamined Patent Publications Nos. 6-267900 and 8-181125 have suggested methods of etching a wiring layer. In the methods, an ECR plasma source applies RF bias voltage having a frequency of 600 kHz or smaller to a gas with a pulse cycle being 100 μsec or smaller and pulse-off time being in the range of 10 to 100 μsec. As a result, positive and negative ions are effectively produced, and thus, electric charges are not accumulated on sidewalls of a resist mask.

In particular, Japanese Unexamined Patent Publication No. 6-267900 teaches that it would be possible to prevent micro-loading which occurs when a contact hole having a high aspect ratio is to be formed by etching, by generating plasma which is modulated with pulses having a frequency of 50 kHz.

Japanese Unexamined Patent Publication No. 61-13625 has suggested a plasma-etching apparatus comprising first means for generating plasma from process gas introduced into a reaction chamber, second means for accelerating ions in plasma to thereby radiate the thus accelerated ions to an object, third means for modulating a discharge voltage, and fourth means for modulating an applied voltage. The fourth means AM- or FM-modulates an applied voltage to thereby control a profile of electron temperature, a composition ratio of reaction species, and an ion energy profile.

The above-mentioned conventional plasma etching apparatuses, in particular, ECR plasma etching apparatus make use of expensive magnets. In addition, it is reported that those magnets would degrade electric characteristics of a sample. For this reason, an inducive coupling plasma (ICP) etching apparatus is presently suggested in place of the above-mentioned conventional plasma etching apparatuses. Though the ICP etching apparatus generates plasma having a smaller density than a density of plasma generated in ECR plasma etching apparatus, the ICP etching apparatus has a simpler structure than that of ECR plasma etching apparatus, because the ICP etching apparatus includes no magnets. In addition, the ICP etching apparatus has advantages of less electric damage to a gate insulating film, higher mechanical reliability, higher maintenance ability and lower fabrication and running costs relative to the other etching apparatuses.

Japanese Unexamined Patent Publication No. 9-92645 has suggested a method of fabricating a semiconductor device, comprising the steps of transferring a semiconductor wafer into a plasma etching chamber, and applying plasma to a semiconductor wafer. The semiconductor wafer includes a gate insulating film having a dielectric breakdown voltage of X volts and a thickness of 10 nm or smaller, an electrically conductive layer formed on the gate insulating film and having an antenna structure having an antenna ratio of 500 or greater, and a patterned insulator formed on the electrically conductive layer and including apertures each having an aspect ratio greater than 1. In plasma, electron temperature Te (eV) is kept equal to or smaller than X (Te≦X).

In the suggested method, RF voltage having a frequency of 13.56 MHz is applied to process gas to thereby plasma in ICP etching apparatus, and RF power having a frequency of 66.7 kHz is applied to a substrate to thereby control a substrate voltage. RF signals having waveforms analogous to RF output waveforms are detected from an RF bias voltage source, and the thus detected RF signals are transmitted to a pulse generator. The pulse generator generates pulses having desired pulse-on time which is synchronized to a desired phase in a cycle period equal to a cycle period of the received RF signals. The pulses generated by the pulse generator are transmitted to a power source to modulate or turn on or off RF power having a frequency of 13.56 MHz, in accordance with the pulses. Specifically, pulse-on time is set equal to 5 μsec, a pulse-off time is set equal to 10 μsec, and a phase angle is set equal to 240 degrees. Thus, it would be possible to keep an electron temperature below a dielectric breakdown voltage of a gate insulating film.

According to the Publication, as a pulse-off time is set longer, a period of time in which an electron temperature is reduced becomes longer, and an electron temperature at the end of the period is further reduced. The Publication sets forth that remarkable reduction in damage to a gate insulating layer is dependent on the above-mentioned reduction in an electron temperature.

SUMMARY OF THE INVENTION

It is an object of the present invention to provide a method for fabricating a semiconductor device, including a step of patterning a wiring layer through inducive coupling plasma, which method makes it possible to prevent occurrence of electron shading damage to a gate insulating film and etch a wiring layer with high accuracy-and high reliability.

It is also an object of the present invention to provide an apparatus for fabricating a semiconductor device, which apparatus generates inducive coupling plasma to thereby etch a wiring layer without occurrence of electron shading damage to a gate insulating film.

In one aspect of the present invention, there is provided a method of fabricating a semiconductor device, including the steps of (a) generating plasma in the following conditions: (a1) an RF bias voltage has a frequency equal to or greater than 1 MHz, (a2) an RF source voltage has a frequency equal to or greater than 1 MHz, (a3) the RF source voltage is modulated by pulses in a cycle equal to or greater than 100 μsec, and (a4) pulse-on time is equal to or greater than 50 μsec, and (b) patterning multi-layered metal wirings by etching through the plasma.

It is preferable that the pulses have a rectangular waveform.

It is preferable that the cycle is equal to or smaller than 500 μsec, and the pulse-on time is equal to or smaller than 450 μsec.

It is preferable that the multi-layered metal wirings are composed of aluminum or aluminum alloy, in which case, the multi-layered metal wirings preferably make electrical contact with an n-channel MOSFET. It is also preferable that the n-channel MOSET includes a gate insulating film having a thickness equal to or smaller than 6 nm.

It is preferable that the multi-layered metal wirings have an antenna ratio in the range of 1,000 to 100,000 both inclusive, and wirings in the multilayered metal wirings are spaced away from adjacent ones by 0.3 μm or greater.

It is preferable that the multi-layered metal wirings have an antenna ratio in the range of 1,000 to 40,000 both inclusive.

It is preferable that pulse-off time is equal to or smaller than 100 μsec, and that the pulse-off time is equal to or greater than 20 μsec, preferably than 30 μsec.

In another aspect of the present invention, there is provided an apparatus for fabricating a semiconductor device, including (a) a hermetically sealed chamber, (b) a gas introducer for introducing gas into the chamber, (c) a gas exhauster for exhausting gas from the chamber, (d) an RF source voltage supplier applying an RF source voltage having a frequency equal to or greater than 1 MHz to the chamber to thereby generate inducive coupling plasma from the gas, (e) an RF bias voltage source applying an RF bias voltage to a substrate put in the chamber, the RF bias voltage having a frequency equal to or greater than 1 MHz, and (f) a pulse generator which transmits pulses to the RF source voltage supplier to thereby modulate the RF source voltage supplier in a cycle equal to or greater than 100 μsec with pulse-on time being kept equal to or greater than 50 μsec.

It is preferable that the pulse generator generates pulses each having a rectangular waveform.

It is preferable that the pulse generator transmits pulses to the RF source voltage supplier to thereby modulate the RF source voltage supplier in a cycle equal to or smaller than 500 μsec with the pulse-on time being kept equal to or smaller than 450 μsec.

It is preferable that the semiconductor device includes multi-layered metal wirings composed of aluminum or aluminum alloy, in which case, it is also preferable that the semiconductor device further includes an n-channel MOSFET with which the multi-layered metal wirings make electrical contact. It is preferable that the n-channel MOSET includes a gate insulating film having a thickness equal to or smaller than 6 nm.

It is preferable that the pulse generator transmits pulses to the RF source voltage supplier to thereby modulate the RF source voltage with pulse-off time being equal to or smaller than 100 μsec, but equal to or greater than 20 μsec, preferably than 30 μsec.

The advantages obtained by the aforementioned present invention will be described hereinbelow.

In accordance with the present invention, conditions for generating plasma when multi-layered metal wirings are to be patterned are determined as follows.

A frequency of the RF bias voltage: 1 MHz or greater

A frequency of the RF source voltage: 1 MHz or greater

A cycle in which the RF source voltage is modulated: 100 μsec or greater

Pulse-on time: 50 μsec or greater

By determining the conditions as mentioned above, it would be possible to reduce charging damage to a gate insulating film, even if wirings are further spaced away from adjacent ones and/or an antenna ratio of the multi-layered metal wirings is further increased It should be noted that conditions for generating plasma are not to be limited to the above-mentioned ones, but may be varied within the scope of the present invention.

In addition, the present invention is preferably applied to multi-layered metal wirings composed of aluminum or alloy thereof, but may be applied to a layer composed of other materials such as polysilicon or silicon dioxide.

The above and other objects and advantageous features of the present invention will be made apparent from the following description made with reference to the accompanying drawings, in which like reference characters designate the same or similar parts throughout the drawings.

BRIEF DESCRIPTION OF THE DRAWINGS

FIG. 12 is a graph showing a relation between an electron temperature and pulse-on time.

DESCRIPTION OF THE PREFERRED EMBODIMENTS

Figure 1:
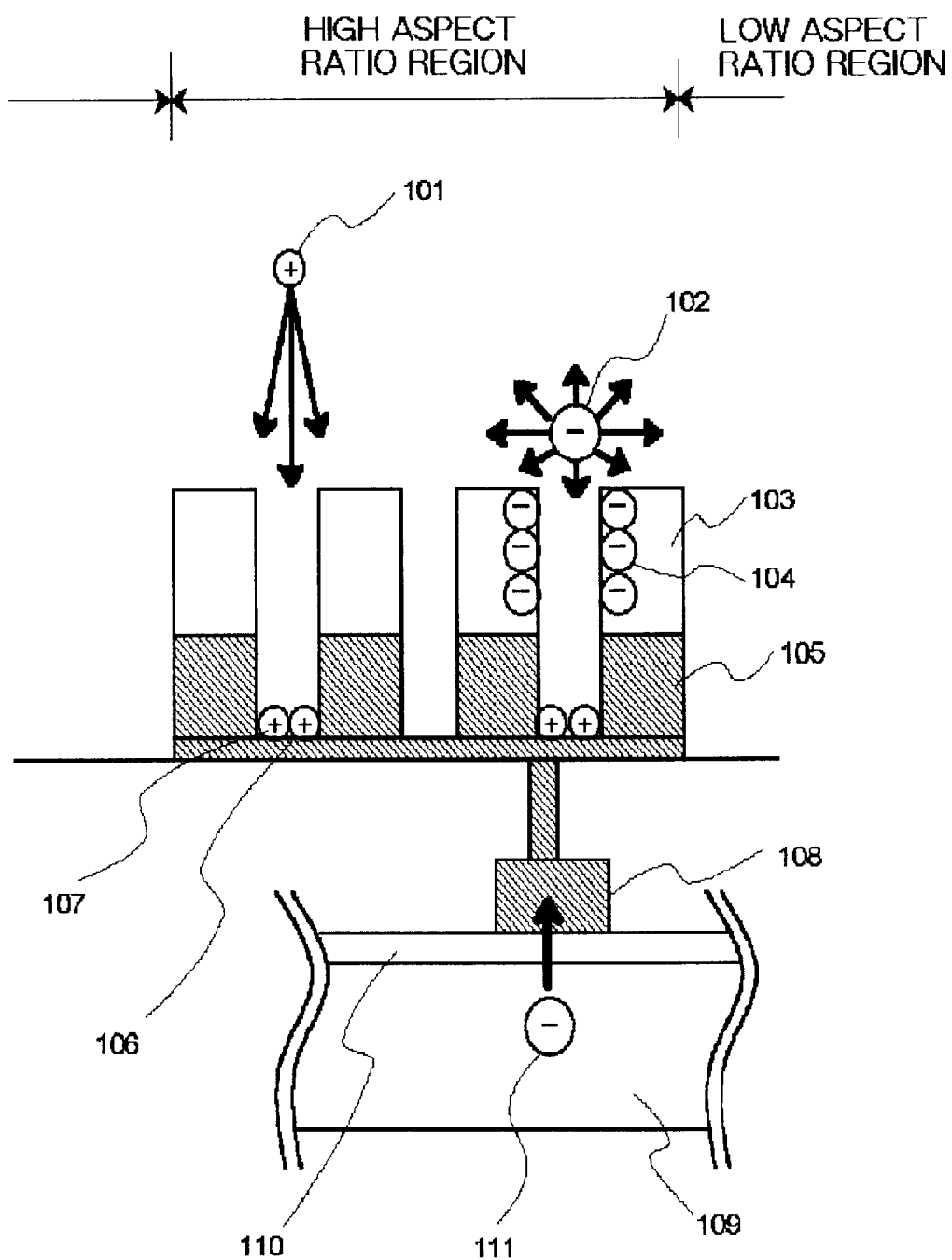
FIG. 1 illustrates a model for explaining electron shading damage.
Figure 2:
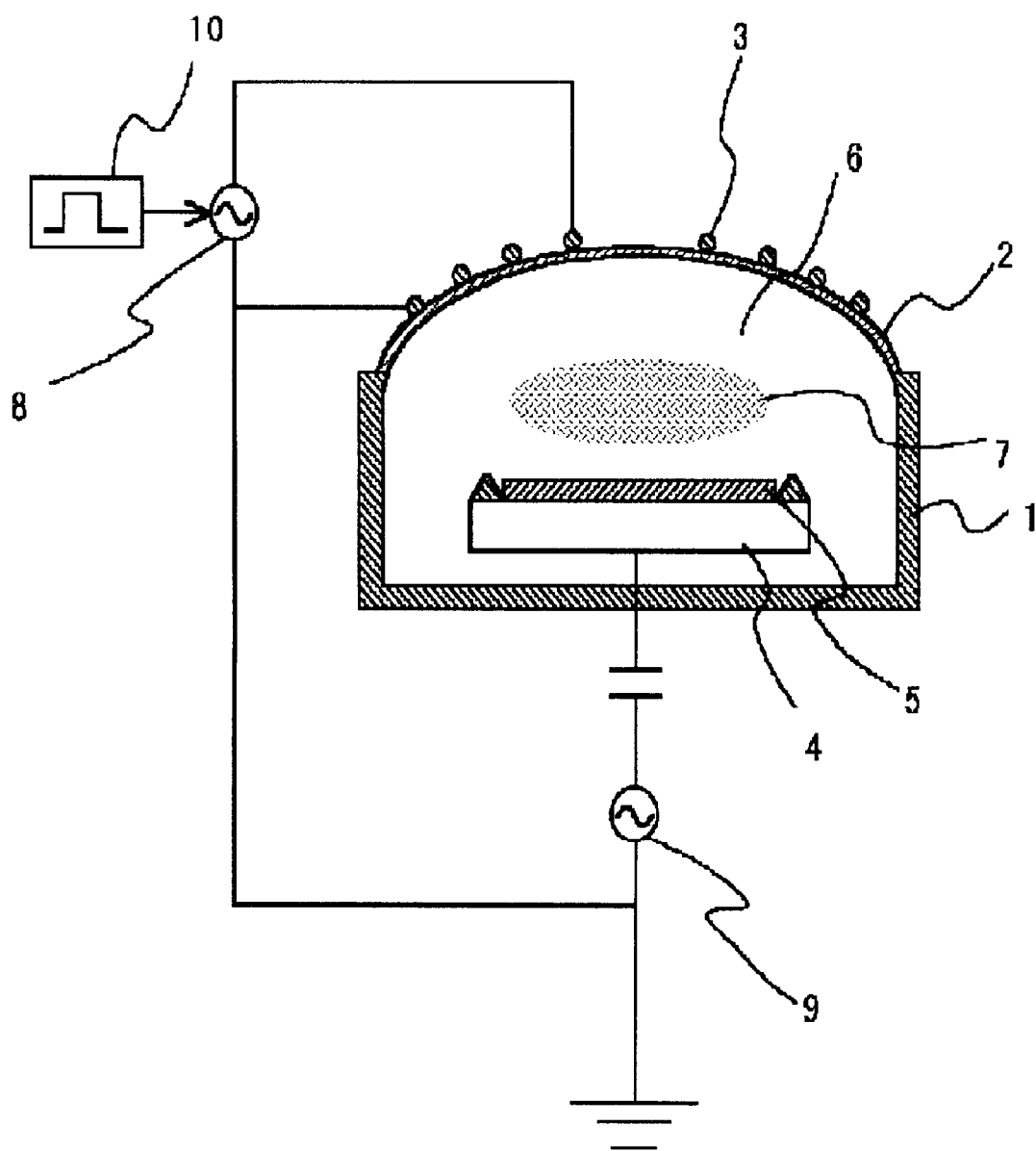
FIG. 2 illustrates an apparatus for etching a wiring layer in accordance with an embodiment of the present invention.

FIG. 2 illustrates an apparatus for patterning a wiring layer through inducive coupling plasma, in accordance with a preferred embodiment of the present invention.

The illustrated apparatus is comprised of a container 1 made of stainless, a bell jar 2 made of quartz or ceramics and located above the container 1 to cooperate with the container 1 to define a hermetically sealed reaction chamber 6 in the container 1 and the bell jar 2, a coil 3 located on the bell jar 2 for generating micro-waves which are transmissible through the bell jar 2, a susceptor 4 placed in the reaction chamber 6 for mounting a substrate 5 thereon, an RF source voltage supplier 8 applying an RF source voltage to the reaction chamber 6 through the coil 3, a pulse generator 10 transmitting pulses to the RF source voltage supplier 8, and an RF bias source 9 applying an RF bias voltage to the suseceptor 4.

Though not illustrated, the apparatus further includes a gas exhauster which exhausts gas out of the reaction chamber 6 to thereby keep the reaction chamber 6 at a desired vacuum degree, a gas introducer which introduces etchant gas such as $BCl_3$ and $Cl_2$ into the reaction chamber 6 in a controlled amount, and a temperature controller incorporated in the susceptor 4 for cooling or heating the substrate 5 to thereby keep the substrate 5 at a constant temperature.

When inducive coupling plasma 7 is to be generated in the reaction chamber 6, an RF source voltage having a frequency equal to or greater than 1 MHz is applied into the reaction chamber 6 from the RF source voltage supplier 8 through the coil 3. At the same time, an RF bias voltage having a frequency equal to or greater than 1 MHz is applied to the susceptor 4 from the RF bias source 9 to thereby control a voltage of the substrate 5 such that ions in the inducive coupling plasma 7 are accelerated to a desired degree and thus caused to impinge on the substrate 5.

In the embodiment, both of the RF source voltage and the RF bias voltage are designed to have a frequency of 1 MHz or greater. The reason why the RF source voltage has a frequency equal to or greater than 1 MHz is that inducive coupling plasma can be generated more readily and more stably than when the RF source voltage has a frequency smaller than 1 MHz. The reason why the RF bias voltage has a frequency equal to or greater than 1 MHz is as follows. If the RF bias voltage had a frequency smaller than 1 MHz, a profile of ion energy becomes extensive from a lower energy band to a higher energy band, that is, a half band width is made extensive. As a result, ions in higher energy band deteriorate resist selectivity. By designing the RF bias voltage to have a frequency equal to or greater than 1 MHz, a half band width can be made narrower, and hence, resist selectivity would be less deteriorated.

In the embodiment, the RF source voltage generated by the RF power source 8 is modulated by pulses generated by the pulse generator 10 and having rectangular waveforms, into a voltage having both a period of 100 μsec or greater, that is, a frequency of 10 kHz or smaller, and pulse-on time of 50 μsec or greater.

Hereinbelow is explained an example showing how much an insulating layer is damaged in dependence on how the RF source voltage is modulated with pulses.

In this example, it is assumed that there are formed a gate insulating film having a thickness of 6 nm, a gate electrode having a gate length of 0.25 μm and a gate width of 10 μm, and wirings formed around the gate electrode and having an antenna structure. Varying a space between adjacent wirings and an antenna ratio, there was measured a threshold voltage Vt of an n-channel MOSFET. In the measurement of the threshold voltage Vt, a drain voltage Vd was set equal to 2.0 V, and a drain current Id was set equal to 0.2 A.

The results of the measurement were shown in FIGS. 3 to 11.

In FIGS. 3 to 8, $Cl_2$ and $BCl_3$ gases were used as etchant gases in flow rates of 110 and 45 sccm, respectively, and $CHF_3$ gas was used as an additive gas in a flow rate of 10 sccm. The RF source voltage supplied from the RF power source 8 was designed to have a frequency of 2 MHz and to be equal to 1000 W. and the RF bias voltage generated from the RF bias voltage source 9 was designed to have a frequency of 13.56 MHz and to be equal to 300 W. The substrate 5 was etched at a pressure of 10 mTorr and at a temperature of 60 degrees centigrade in the apparatus illustrated in FIG. 2.

Figure 8:
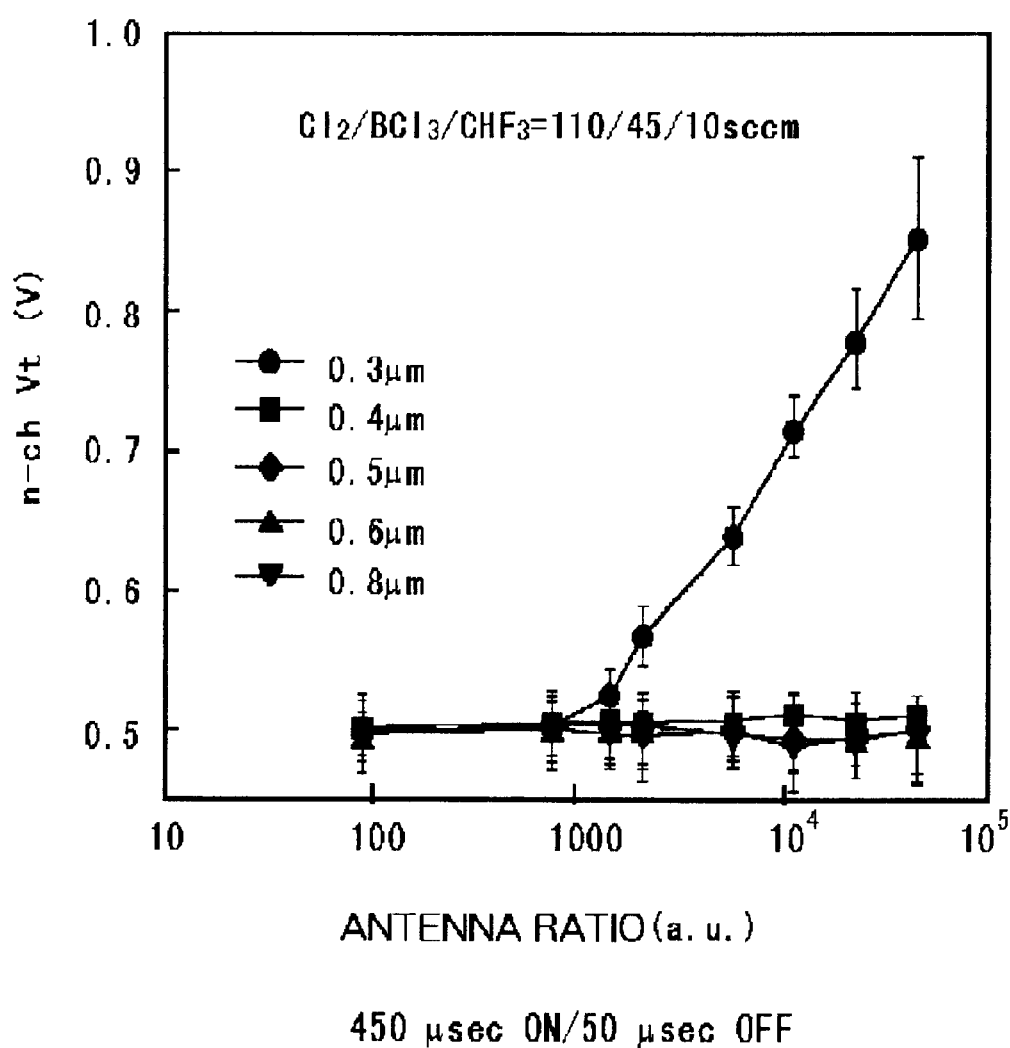
FIG. 8 is a graph showing a relation between an antenna ratio and a threshold voltage in various spacings between wiring layers at pulse-on time of 450 μsec.
Figure 9:
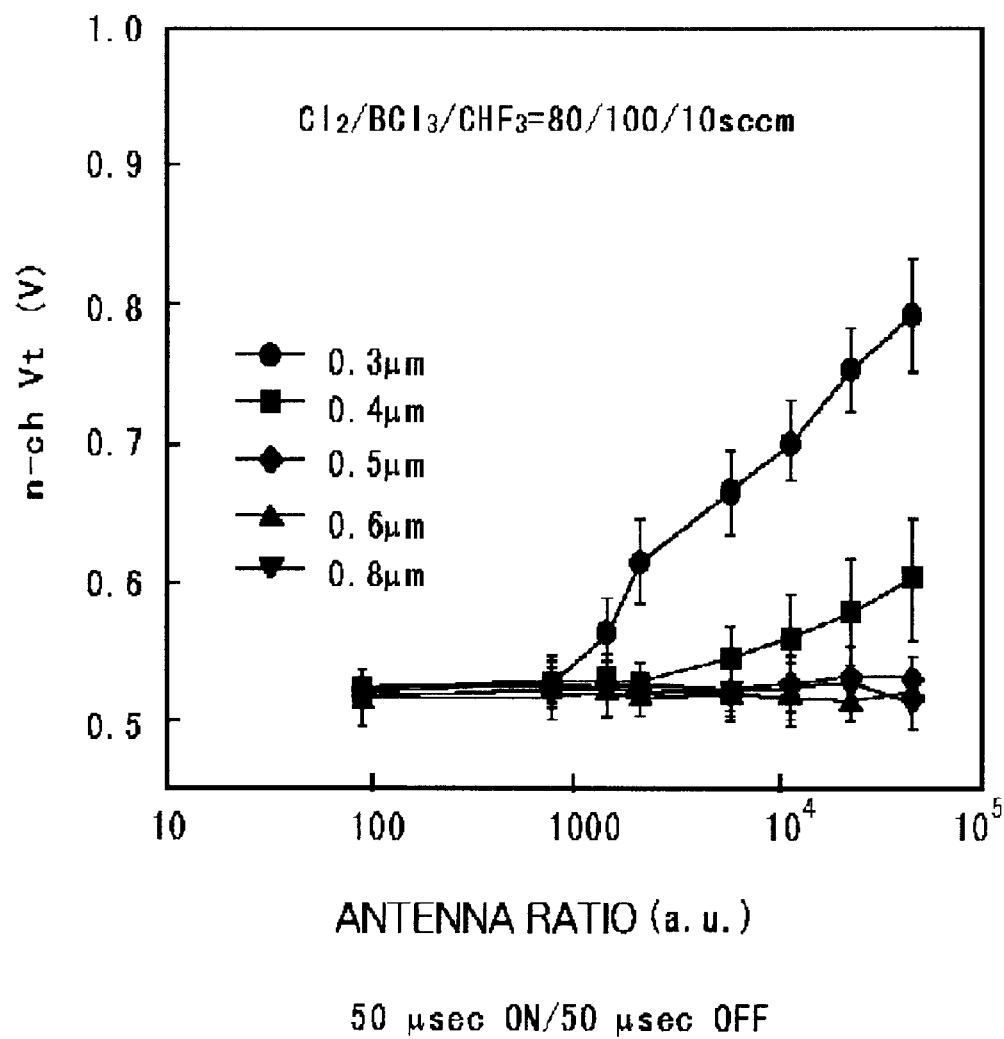
FIG. 9 is a graph showing a relation between an antenna ratio and a threshold voltage in various spacings between wiring layers at pulse-on time of 50 μsec.
Figure 10:
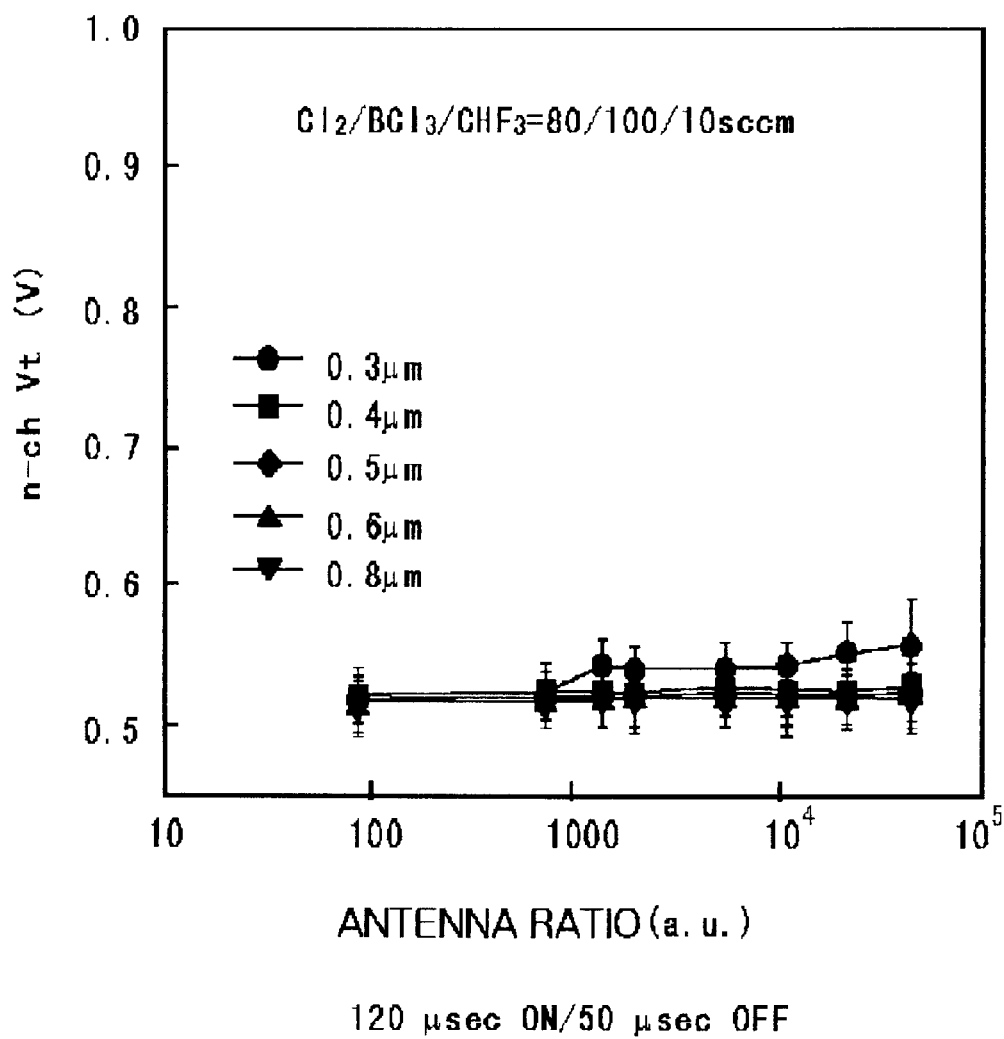
FIG. 10 is a graph showing a relation between an antenna ratio and a threshold voltage in various spacings between wiring layers at pulse-on time of 120 μsec.
Figure 11:
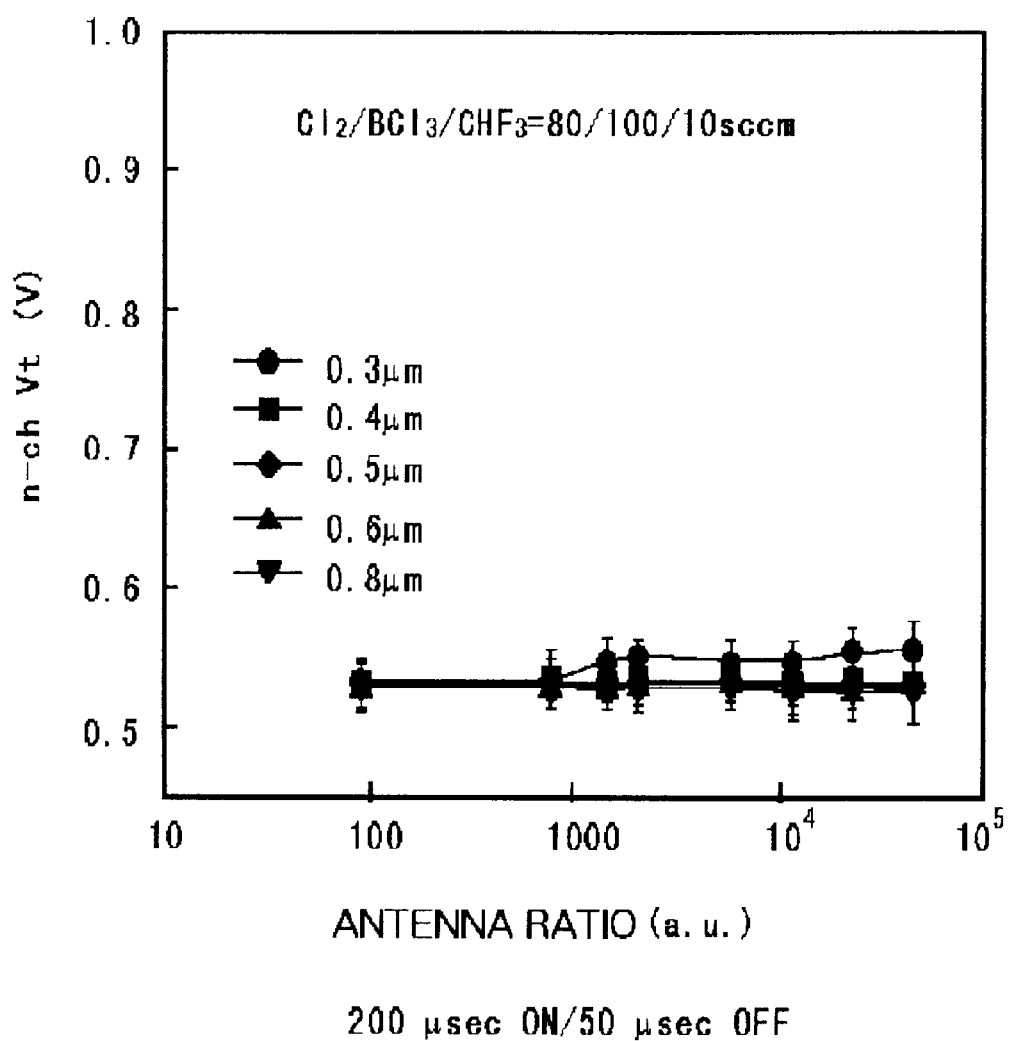
FIG. 11 is a graph showing a relation between an antenna ratio and a threshold voltage in various spacings between wiring layers at pulse-on time of 200 μsec.

In FIGS. 9 to 11, $Cl_2$, $BCl_3$ and $CHF_3$ gases were flown into the reaction chamber 6 in amounts of 80, 100 and 10 sccm, respectively. The other conditions are the same as the above-mentioned conditions in FIGS. 3 to 8.

Figure 3:
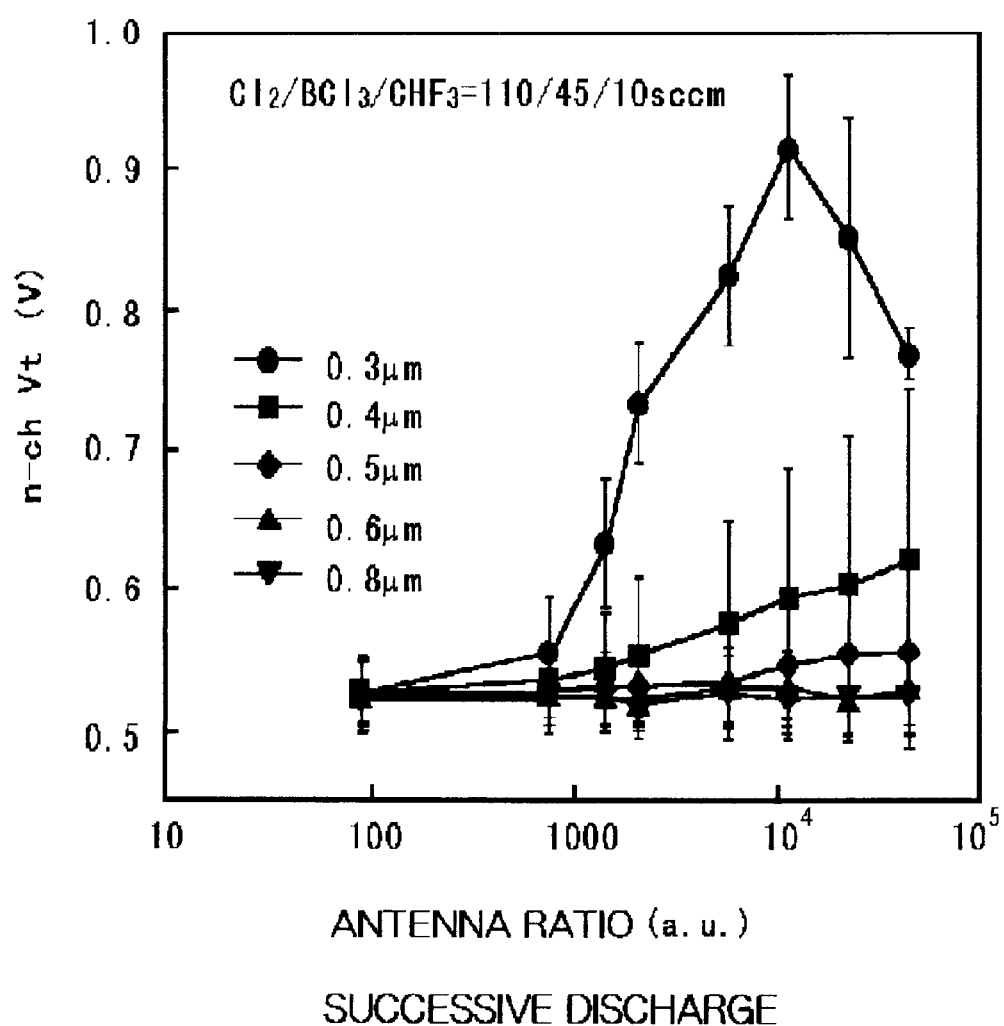
FIG. 3 is a graph showing a relation between an antenna ratio and a threshold voltage in various spacings between wiring layers.

FIG. 3 shows the result of the measurement in prior art in which pulse discharge is not carried out. In FIG. 3, the threshold voltage Vt starts increasing when an antenna ratio is over 1000 in the cases that spacings between adjacent wirings are 0.3 μm, 0.4 μm and 0.5 μm. In particular, in a case that a spacing between adjacent wirings is equal to 0.3 μm, the threshold voltage Vt starts lowering when an antenna ratio is over 10000. This reduction in the threshold voltage Vt corresponds to complete breakdown of a gate oxide film.

Figure 4:
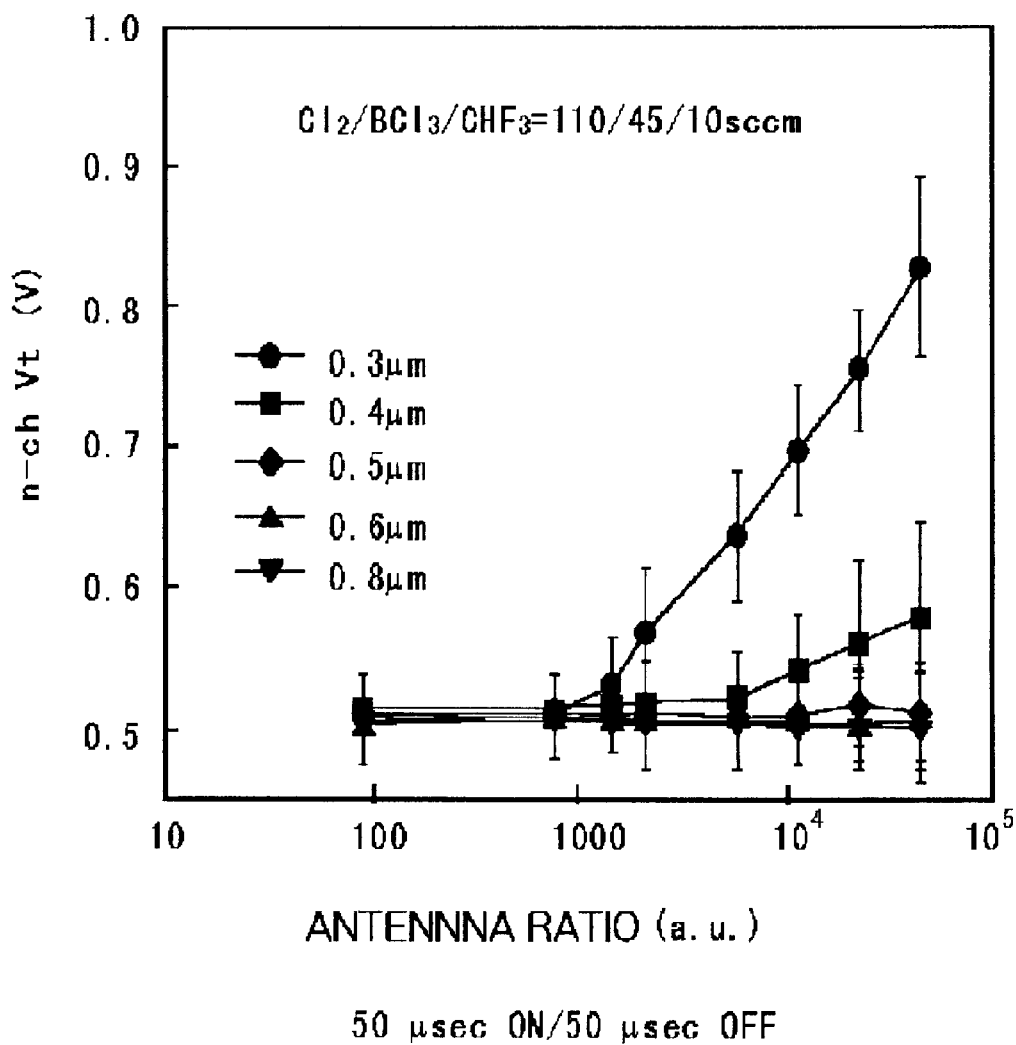
FIG. 4 is a graph showing a relation between an antenna ratio and a threshold voltage in various spacings between wiring layers at pulse-on time of 50 μsec.

In FIG. 4, pulse-on time and pulse-off time were both set equal to 50 μsec. In cases that spacings between adjacent wirings are 0.3 μm and 0.4 μm, the threshold voltage Vt starts increasing when an antenna ratio is over about 1000. However, in cases that spacings between adjacent wirings are 0.5 μm, 0.6 μm and 0.8 μm, the threshold voltage Vt is kept constant, even if an antenna ratio is higher and higher. This shows that the present invention properly works in the case illustrated in FIG. 4.

Figure 5:
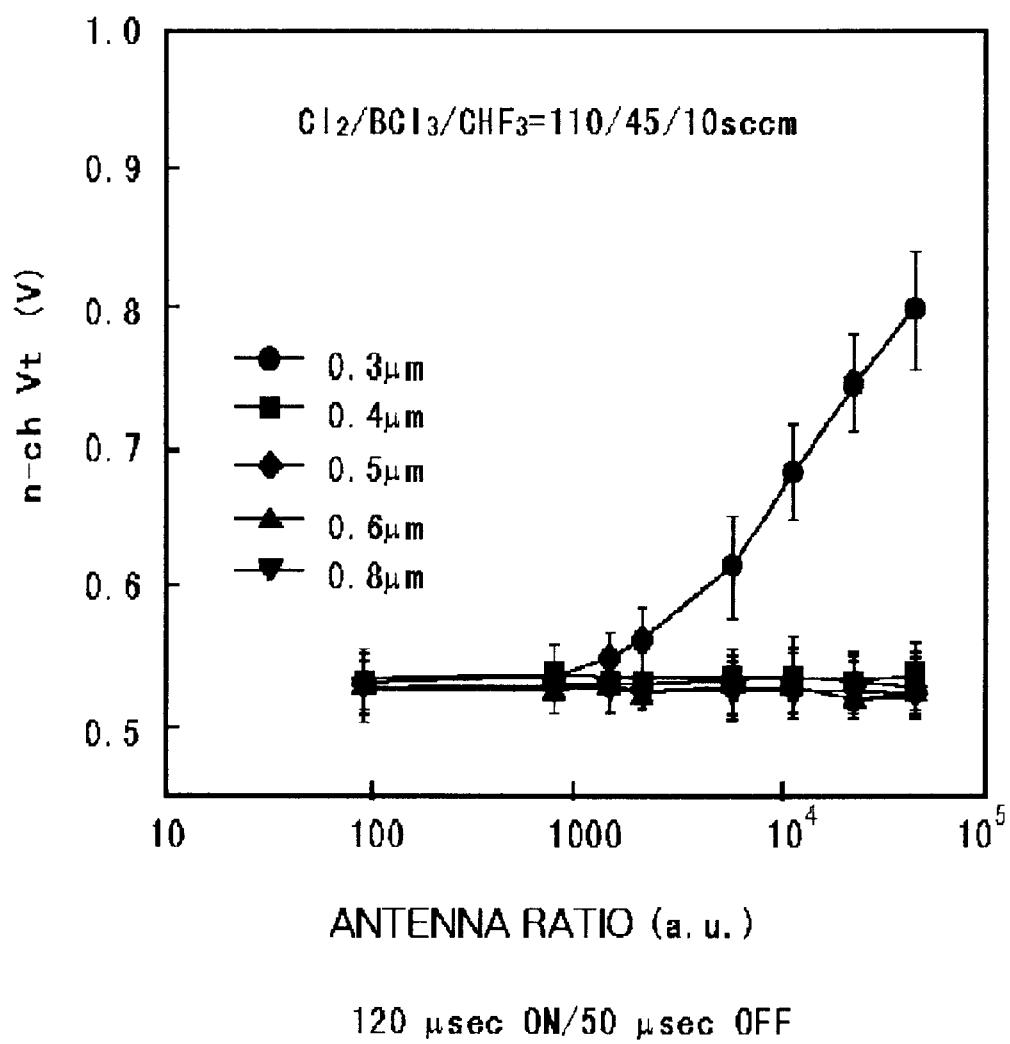
FIG. 5 is a graph showing a relation between an antenna ratio and a threshold voltage in various spacings between wiring layers at pulse-on time of 120 μsec.
Figure 6:
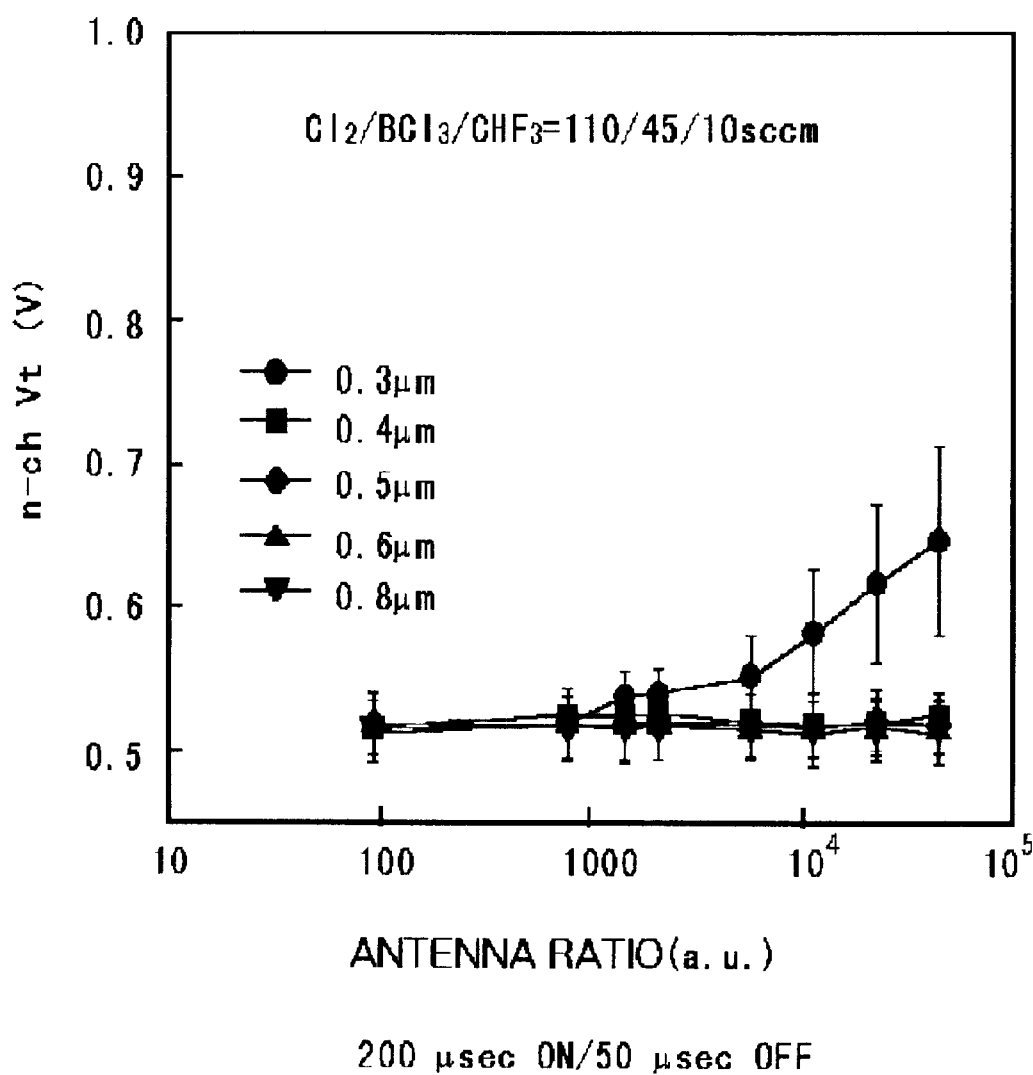
FIG. 6 is a graph showing a relation between an antenna ratio and a threshold voltage in various spacings between wiring layers at pulse-on time of 200 μsec.

As illustrated in FIGS. 5 and 6, it is understood that the threshold voltage Vt is prevented from increasing, as pulse-on time is set longer and longer.

Figure 7:
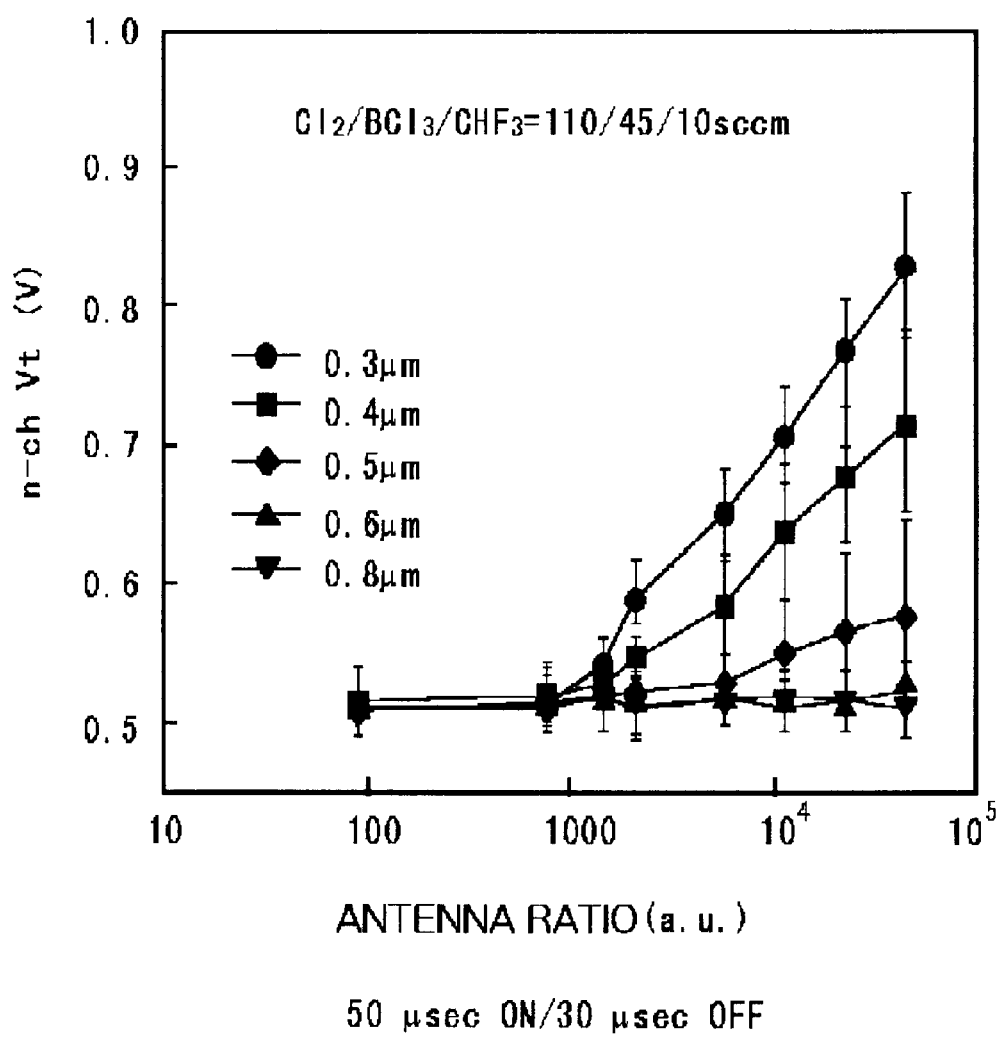
FIG. 7 is a graph showing a relation between an antenna ratio and a threshold voltage in various spacings between wiring layers without the scope of the present invention.

FIG. 7 shows a case which is out of the scope of the present invention. In FIG. 7, the threshold voltage Vt increases even in a case that a spacing between adjacent wirings is set equal to 0.5 μm.

However, if pulse-on time is set too long, the threshold voltage Vt increases again. As illustrated in FIG. 8, an upper limit of a pulse cycle is about 500 μsec, and an upper limit of pulse-on time is about 450 μsec.

In FIGS. 9 to 11 wherein a flow rate ratio among etchant gases is varied, it is confirmed that the threshold voltage Vt is prevented from increasing. Since FIG. 9 exhibits almost the same results as the results shown in FIG. 3, it is understood that a pulse cycle has to be equal to or greater than 100 μsec, and pulse-on time has to be equal to or greater than 50 μsec.

Hereinbelow is explained why the advantages can be obtained in the present invention.

FIG. 12 shows how a temperature of electrons in plasma varies when pulse-off time is kept equal to 50 μsec and pulse-on time is varied. As references, FIG. 12 also shows how a temperature of electrons varies in successive discharge not modulated with pulses and how a temperature of electrons in plasma varies when pulse-off time is kept equal to 30 μsec and pulse-on time is kept equal to 50 μsec. The latter corresponds to the case illustrated in FIG. 7.

It is conventionally known to those skilled in the art that plasma damage could be suppressed by lowering a temperature of electrons. A temperature of electrons has been conventionally requested to lower in average among electrons. However, thereafter, it is said that a gate insulating layer is not so much damaged at an initial stage in generation of plasma.

In the present invention, a temperature of electrons is slightly higher than a temperature of electrons observed in successive discharge at a start-up of generation of pulses as pulse-on time is set longer. However, at the same time, an amplitude of a temperature of electrons becomes greater, and a temperature of electrons becomes smaller. It is considered that a temperature of electrons is more likely to be reduced by setting pulse-on time longer, and as a result, the above-mentioned advantages can be obtained.

This is just contrary to the conventional belief that longer pulse-off time is more effective for reducing a temperature of electrons than longer pulse-on time. This fact that longer pulse-on time is effective for reducing a temperature of electrons was first discovered by the inventor.

It should be noted that pulse-off time is not to be limited to specific time. However, if pulse-off time is set too long, plasma would be vanished with the result of failure in etching. Thus, though dependent on a pulse cycle, pulse-off time is necessary to be equal to or smaller than about 100 $\mu$sec.

To the contrary, shorter pulse-off time would provide a plasma density almost equal to a density of successive discharge. However, if pulse-off time is set too short, a temperature of electrons would be insufficiently lowered. Hence, though dependent on length of pulse-on time, pulse-off time is necessary to be equal to or greater than 20 $\mu$sec, preferably, than 30 $\mu$sec.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 11-100112 filed on Apr. 7, 1999 including specification, claims, drawings and summary is incorporated herein by reference in its entirety.

What is claimed is:

1. A method of fabricating a semiconductor device, comprising the steps of:
   (a) generating plasma in the following conditions:
   (a1) an RF bias voltage has a frequency equal to or greater than 1 MHz;
   (a2) an RF source voltage has a frequency equal to or greater than 1 MHz;
   (a3) said RF source voltage is modulated by pulses in a cycle equal to or greater than 100 $\mu$sec; and
   (a4) pulse-on time is equal to or greater than 50 $\mu$sec, and
   (b) patterning multi-layered metal wirings by etching through said plasma.

2. The method as set forth in claim 1, wherein said pulses have a rectangular waveform.

3. The method as set forth in claim 1, wherein said cycle is equal to or smaller than 500 $\mu$sec, and said pulse-on time is equal to or smaller than 450 $\mu$sec.

4. The method as set forth in claim 1, wherein said multi-layered metal wirings have an antenna ratio in the range of 1,000 to 100,000 both inclusive, and wirings in said multi-layered metal wirings are spaced away from adjacent ones by 0.3 $\mu$m or greater.

5. The method as set forth in claim 4, wherein said multi-layered metal wirings have an antenna ratio in the range of 1,000 to 40,000 both inclusive.

6. The method as set forth in claim 1, wherein said multi-layered metal wirings are composed of aluminum or aluminum alloy.

7. The method as set forth in claim 6, wherein said multi-layered metal wirings make electrical contact with an n-channel MOSFET.

8. The method as set forth in claim 7, wherein said n-channel MOSET includes a gate insulating film having a thickness equal to or smaller than 6 nm.

9. The method as set forth in claim 1, wherein pulse-off time is equal to or smaller than 100 $\mu$sec.

10. The method as set forth in claim 9, wherein said pulse-off time is equal to or greater than 20 $\mu$sec.

11. The method as set forth in claim 10, wherein said pulse-off time is equal to or greater than 30 $\mu$sec.

* * * * *